(12) United States Patent
Yoshino et al.

(10) Patent No.: US 11,552,166 B2
(45) Date of Patent: Jan. 10, 2023

(54) SEMICONDUCTOR DEVICE COMPRISING RESURF ISOLATION STRUCTURE SURROUNDING AN OUTER PERIPHERY OF A HIGH SIDE CIRCUIT REGION AND ISOLATING THE HIGH SIDE CIRCUIT REGION FROM A LOW SIDE CIRCUIT REGION

(71) Applicant: Mitsubishi Electric Corporation, Tokyo (JP)

(72) Inventors: Manabu Yoshino, Tokyo (JP); Kazuhiro Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 170 days.

(21) Appl. No.: 16/989,021

(22) Filed: Aug. 10, 2020

(65) Prior Publication Data
US 2021/0226003 A1    Jul. 22, 2021

(30) Foreign Application Priority Data
Jan. 17, 2020 (JP) .............................. JP2020-006048

(51) Int. Cl.
*H01L 29/00* (2006.01)
*H01L 29/06* (2006.01)
(52) U.S. Cl.
CPC ........ *H01L 29/0642* (2013.01); *H01L 29/063* (2013.01)
(58) Field of Classification Search
CPC ......................... H01L 29/063; H01L 29/0642
See application file for complete search history.

(56) References Cited

U.S. PATENT DOCUMENTS

| 5,894,156 | A | 4/1999 | Terashima et al. |
| 2019/0229106 | A1 | 7/2019 | Nagai |
| 2020/0203474 | A1* | 6/2020 | Yoshino .................. H01L 27/08 |

FOREIGN PATENT DOCUMENTS

| DE | 696 20 1 49 T2 | 10/2002 |
| DE | 11 2016 007 213 T5 | 6/2019 |

(Continued)

OTHER PUBLICATIONS

An Office Action issued by the German Patent and Trade Mark Office dated Aug. 31, 2022, which corresponds to German Patent Application No. 10202012693.3 and is related to U.S. Appl. No. 16/989,021; with English language translation.

*Primary Examiner* — Reema Patel
(74) *Attorney, Agent, or Firm* — Studebaker & Brackett PC

(57) ABSTRACT

A high withstand voltage isolation region has a first diffusion layer of a second conductivity type formed on a principal surface of a semiconductor substrate. The high withstand voltage MOS has a second diffusion layer of the second conductivity type formed on the principal surface of the semiconductor substrate. A low side circuit region has a third diffusion layer of a first conductivity type formed on the principal surface of the semiconductor substrate. A fourth diffusion layer of the first conductivity type having a higher impurity concentration than the semiconductor substrate is formed on the principal surface of the semiconductor substrate exposed between the first diffusion layer and the second diffusion layer. The fourth diffusion layer extends from the high side circuit region to the low side circuit region and does not contact the third diffusion layer.

22 Claims, 13 Drawing Sheets

(56) References Cited

FOREIGN PATENT DOCUMENTS

| | | |
|---|---|---|
| DE | 10 2019 200 047 A1 | 7/2019 |
| JP | 3917211 B2 | 5/2007 |
| WO | WO-2018051412 A1 * | 3/2018 ......... H01L 27/0617 |

* cited by examiner

SEMICONDUCTOR DEVICE COMPRISING RESURF ISOLATION STRUCTURE SURROUNDING AN OUTER PERIPHERY OF A HIGH SIDE CIRCUIT REGION AND ISOLATING THE HIGH SIDE CIRCUIT REGION FROM A LOW SIDE CIRCUIT REGION

BACKGROUND OF THE INVENTION

Field

The present disclosure relates to a semiconductor device.

Background

An HVIC (High Voltage IC) is used in drive of a power chip configuring a half bridge. An HVIC includes a low side circuit region based on a substrate potential, a high side circuit region isolated from a substrate, with a high withstand voltage, and a level shift circuit that performs signal transmission between the low side circuit region and the high side circuit region. The level shift circuit which transmits a signal from the low side circuit region to the high side circuit region performs signal transmission while maintaining a high withstand voltage by turning on/off a high withstand voltage MOS.

The high side circuit region is isolated from the low side circuit region by having an outer periphery thereof surrounded by a high withstand voltage isolation region. The high withstand voltage isolation region is formed by a RESURF isolation structure. Further, the high withstand voltage MOS is formed in the same RESURF isolation structure as the high withstand voltage isolation region. An N type diffusion layer of the high withstand voltage isolation region and an N type diffusion layer of the high withstand voltage MOS are electrically isolated from each other by a slit-shaped isolation part that is exposed to a surface of a P type semiconductor substrate (see Japanese Patent No. 3917211, for example).

The impurity concentration of the isolation part is set so that depletion occurs to such an extent that does not reduce the RESURF withstand voltage of the high withstand voltage isolation region and the high withstand voltage MOS. The width of the isolation part is set so that a punch-through withstand voltage between the high withstand voltage isolation region and the high withstand voltage MOS becomes a control circuit power supply voltage or more.

Further, when the surface of the isolation part is inverted to an N type and a parasitic channel is formed due to an influence of a potential of a wiring layer or the like, a leak current flows between the high withstand voltage isolation region and the high withstand voltage MOS. In order to suppress the leak current, a P type diffusion layer having a higher concentration than a P type semiconductor substrate is formed on the surface of the isolation part. The P type diffusion layer is in contact with a P type layer of the low side circuit region in plan view.

SUMMARY

However, when the impurity concentration of the P type diffusion layer is increased to such an extent to suppress formation of the parasitic channel sufficiently, the RESURF withstand voltage of the high withstand voltage isolation region and the high withstand voltage MOS is reduced. There, has been the problem of being unable to suppress formation of the parasitic channel sufficiently if the impurity concentration is such that the RESURF withstand voltage does not decrease.

The present disclosure has been made to solve the problem as described above, and an object of the present disclosure is to obtain a semiconductor device that can suppress a leak current between a high withstand voltage isolation region and a high withstand voltage MOS without reducing a RESURF withstand voltage of the high withstand voltage isolation region and the high withstand voltage MOS.

A semiconductor device according to the present disclosure includes: a high side circuit region; a low side circuit region; and a RESURF isolation structure surrounding an outer periphery of the high side circuit region and isolating the high side circuit region from the low side circuit region, wherein the high side circuit region, the low side circuit region and the RESURF isolation structure are formed on a single semiconductor substrate of a first conductivity type, the RESURF isolation structure has a high withstand voltage isolation region and a high withstand voltage MOS, the high withstand voltage isolation region has a first diffusion layer of a second conductivity type formed on a principal surface of the semiconductor substrate, the high withstand voltage MOS has a second diffusion layer of the second conductivity type formed on the principal surface of the semiconductor substrate, the low side circuit region has a third diffusion layer of the first conductivity type formed on the principal surface of the semiconductor substrate, a fourth diffusion layer of the first conductivity type having a higher impurity concentration than the semiconductor substrate is formed on the principal surface of the semiconductor substrate exposed between the first diffusion layer and the second diffusion layer, and the fourth diffusion layer extends from the high side circuit region to the low side circuit region and does not contact the third diffusion layer.

In the present disclosure, the fourth diffusion layer having a high concentration does not contact the third diffusion layer in the low side circuit region. Accordingly, the semiconductor substrate at the low side is depleted, and the fourth diffusion layer at the high side becomes electrically floating, so that reduction in RESURF withstand voltage can be suppressed. Further, by forming the fourth diffusion layer with a high concentration at the high side where the potential difference occurs between the high withstand voltage MOS and the high withstand voltage isolation region, it is possible to suppress formation of a parasitic channel. Accordingly, it is possible to suppress a leak current between the high withstand voltage isolation region and the high withstand voltage MOS without reducing a RESURF withstand voltage of the high withstand voltage isolation region and the high withstand voltage MOS.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
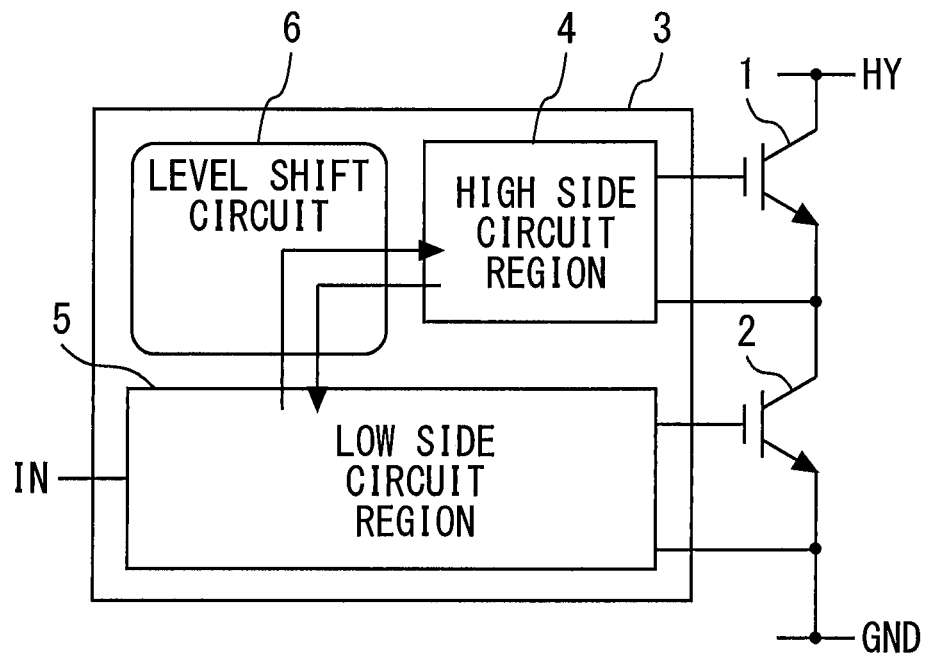
FIG. 1 is a diagram illustrating a semiconductor device according to a first embodiment.

FIG. 1 is a diagram illustrating a semiconductor device according to a first embodiment. The semiconductor device is an HVIC (High Voltage IC) 3 that drives power chips 1 and 2 configuring a half bridge. The HVIC 3 includes a high side circuit region 4 that drives the power chip 1, a low side circuit region 5 that drives the power chip 2, and a level shift circuit 6 that performs signal transmission between the low side circuit region 5 and the high side circuit region 4.

Figure 2:
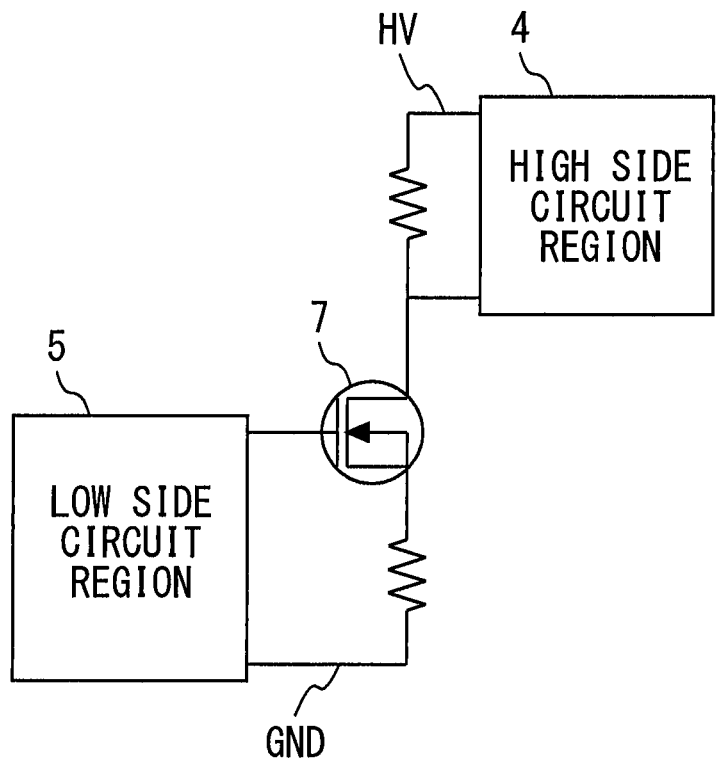
FIG. 2 is a diagram illustrating a high withstand voltage NehMOS of the level shift circuit according to the first embodiment.

FIG. 2 is a diagram illustrating a high withstand voltage NchMOS of the level shift circuit according to the first embodiment. Signal transmission from the low side circuit region 5 to the high side circuit region 4 is performed by a high withstand voltage NchMOS 7 of the level shift circuit 6. Signal transmission from the high side circuit region 4 to the low side circuit region 5 is performed by a high withstand voltage PchMOS (not illustrated).

Figure 3:
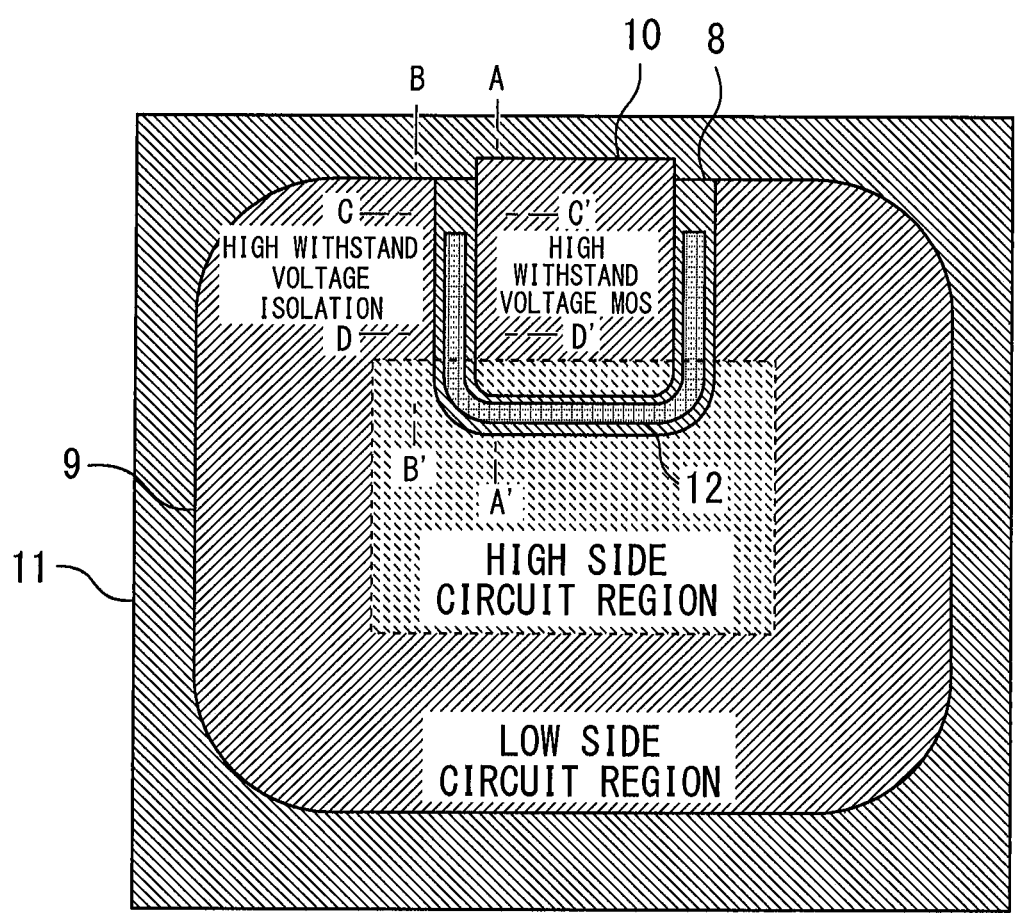
FIG. 3 is a top view illustrating the semiconductor device according to the first embodiment.

FIG. 3 is a top view illustrating the semiconductor device according to the first embodiment. For simplification, only a part of a configuration is illustrated. A RESURF isolation structure surrounds an outer periphery of the high side circuit region in plan view, and isolates the high side circuit region from the low side circuit region. The RESURF isolation structure has a high withstand voltage isolation region and a high withstand voltage MOS. The high withstand voltage MOS may be either the high withstand voltage NchMOS 7 or the high withstand voltage PchMOS described above. The high side circuit region, the low side circuit region and the RESURF isolation structure are formed on a single P type substrate 8. The low side circuit region is based on a substrate potential, and the high withstand voltage isolation region isolates the high side circuit region from the substrate potential with a high withstand voltage. The high withstand voltage MOS has an equivalent withstand voltage to a withstand voltage of the high withstand voltage isolation region.

The high withstand voltage isolation region has an N type diffusion layer 9 formed on a principal surface of the P type substrate 8. The N type diffusion layer 9 is a RESURF region. The high withstand voltage MOS has an N type diffusion layer 10 formed on the principal surface of the P type substrate 8. The low side circuit region has a P type diffusion layer 11 formed on the principal surface of the P type substrate 8.

The P type substrate 8 is exposed between the N type diffusion layer 9 and the N type diffusion layer 10, and between the N type diffusion layer 10 of the high withstand voltage MOS and the high side circuit region. By the exposed P type substrate 8, the high withstand voltage MOS is electrically isolated from the high withstand voltage isolation region and the high side circuit region. Further, a P type diffusion layer 12 having a higher impurity concentration than the P type substrate 8 is formed on the exposed principal surface of the P type substrate 8. The P type diffusion layer 12 extends from the high side circuit region to the low side circuit region, and is continuously formed at a side of the high side circuit region, and does not contact the P type diffusion layer 11 because an unformed region is present at a side of the low side circuit region. The unformed region of the P type diffusion layer 12 at the side of the low side circuit region has such a length that the P type substrate 8 at the side of the low side circuit region is depleted when a high voltage is applied to the high side circuit region.

Figure 4:
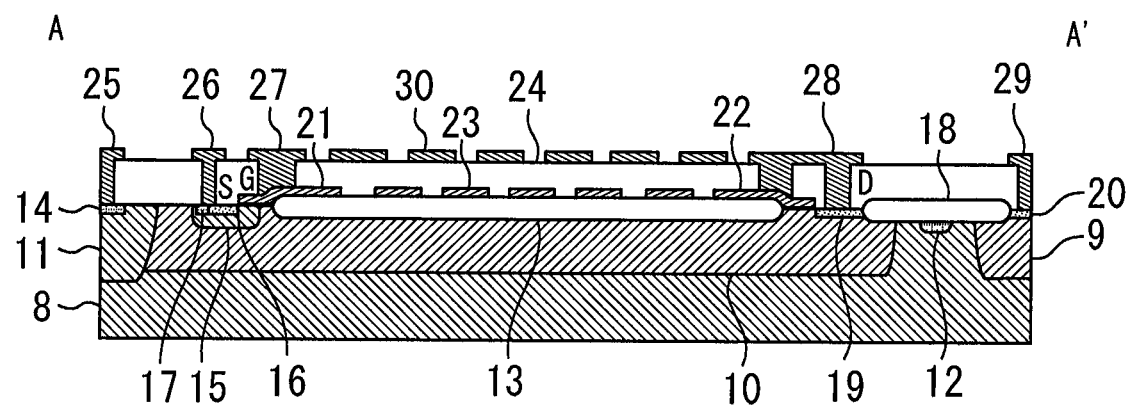
FIG. 4 is a sectional view along A-A' in FIG. 3.

FIG. 4 is a sectional view along A-A' in FIG. 3, and illustrates a sectional structure of the high withstand voltage MOS. The N type diffusion layer 10 of the high withstand voltage MOS is electrically isolated from the N type diffusion layer 9 of the high withstand voltage isolation region, and corresponds to a drain drift layer. A thermal oxide film 13 is formed on a surface of the N type diffusion layer 10. A P$^+$ type diffusion layer 14 is formed on a part of a surface of the P type diffusion layer 11. A P type diffusion layer 15 is formed on the surface of the N type diffusion layer 10 between the P type diffusion layer 11 and the thermal oxide film 13. An N$^+$ type diffusion layer 16 is formed on a part of a surface of the P type diffusion layer 15. A P$^+$ type diffusion layer 17 is formed on a part of the surface of the P type diffusion layer 15.

Between the N type diffusion layer 9 formed in the high side circuit region by being isolated from the N type diffusion layer 10 and the N type diffusion layer 10 of the high withstand voltage MOS, the P type substrate 8 is exposed and is covered with a thermal oxide film 18. An N$^+$ type diffusion layer 19 is formed on the surface of the N type diffusion layer 10 between the thermal oxide film 13 and the thermal oxide film 18. An N$^+$ type diffusion layer 20 is formed on a part of a surface of the N type diffusion layer 9 in the high side circuit region.

Polysilicons 21 and 22 are separated from each other and formed to cover both ends of the thermal oxide film 13. The polysilicon 21 is also formed on the P type diffusion layer 15 via a gate oxide film. A plurality of polysilicons 23 are formed on the thermal oxide film 13 between the polysilicons 21 and 22, are separated from one another, and surround the high side circuit region in plan view. Further thereon, an insulation layer 24 is formed to cover the semiconductor device.

Metal wiring layers 25 to 29 are formed on the insulation layer 24. The metal wiring layer 25 is electrically connected to the P$^+$ type diffusion layer 14 through a contact hole formed in the insulation layer 24. A metal wiring layer 26 is electrically connected to the P$^+$ type diffusion layer 17 and the N$^+$ type diffusion layer 16 through a contact hole formed in the insulation layer 24. A metal wiring layer 27 is electrically connected to the polysilicon 21 through a contact hole formed in the insulation layer 24. A metal wiring layer 28 is electrically connected to the polysilicon 22 and the N$^+$ type diffusion layer 19 through a contact hole formed in the insulation layer 24. The metal wiring layer 29 is electrically connected to the N$^+$ type diffusion layer 20 through a contact hole formed in the insulation layer 24.

A plurality of metal wiring layers 30 that are separated from one another and are not electrically connected are formed on the insulation layer 24 between the metal wiring layer 27 and the metal wiring layer 28, and surrounds the high side circuit region in plan view. The plurality of metal wiring layers 30 overlap the polysilicons 23 each with a certain width. Thereby, the polysilicons 23 and the metal wiring layers 30 are capacitively coupled via the insulation layer 24.

Figure 5:
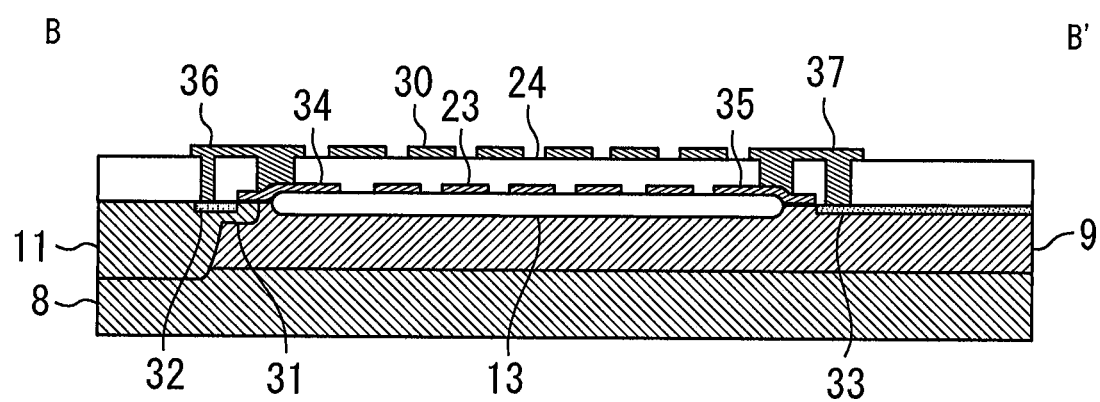
FIG. 5 is a sectional view along B-B' in FIG. 3.

FIG. 5 is a sectional view along B-B' in FIG. 3, and illustrates a sectional structure of the high withstand voltage isolation region. An impurity concentration of the N type diffusion layer 9 is lower than an impurity concentration of the P type diffusion layer 11, but is higher than an impurity concentration of the P type substrate 8. The N type diffusion layer 9 satisfies a RESURF condition, and the N type diffusion layer 9 having a smaller concentration and thickness can obtain a RESURF effect more. A P type diffusion layer 31 is formed inside of the P type diffusion layer 11 to overlap the P type diffusion layer 11 partially. A P$^+$ type diffusion layer 32 is formed on a part of a surface of the P type diffusion layer 31. An N$^+$ type diffusion layer 33 is formed on a surface of the N type diffusion layer 9 separated from the P type diffusion layer 11 by a certain distance. The N type diffusion layer 20 and the N$^+$ type diffusion layer 33 are electrically connected.

The thermal oxide film 13 is formed on the surface of the N type diffusion layer 9 between the P type diffusion layer 11 and the N$^+$ type diffusion layer 33. Polysilicons 34 and 35 are separated from each other and formed to cover both ends of the thermal oxide film 13. The plurality of polysilicons 23 are separated from one another, formed on the thermal oxide film 13 between the polysilicons 34 and 35, and surround the high side circuit region in plan view.

Metal wiring layers 36 and 37 are formed on the insulation layer 24. The metal wiring layer 36 is electrically connected to the P$^+$ type diffusion layer 32 and the polysilicon 34 through a contact hole formed in the insulation layer 24. The metal wiring layer 37 is electrically connected to the N$^+$ type diffusion layer 33 and the polysilicon 35 through a contact hole formed in the insulation layer 24. The metal wiring layer 25 and the metal wiring layer 36 are electrically connected. The metal wiring layer 29 and the metal wiring layer 37 are electrically connected.

Figure 6:
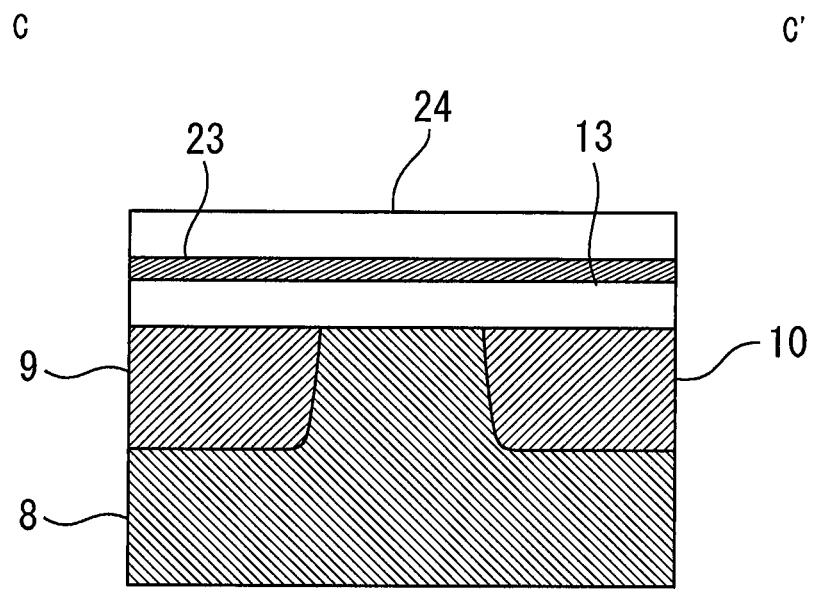
FIG. 6 is a sectional view along C-C' in FIG. 3.
Figure 7:
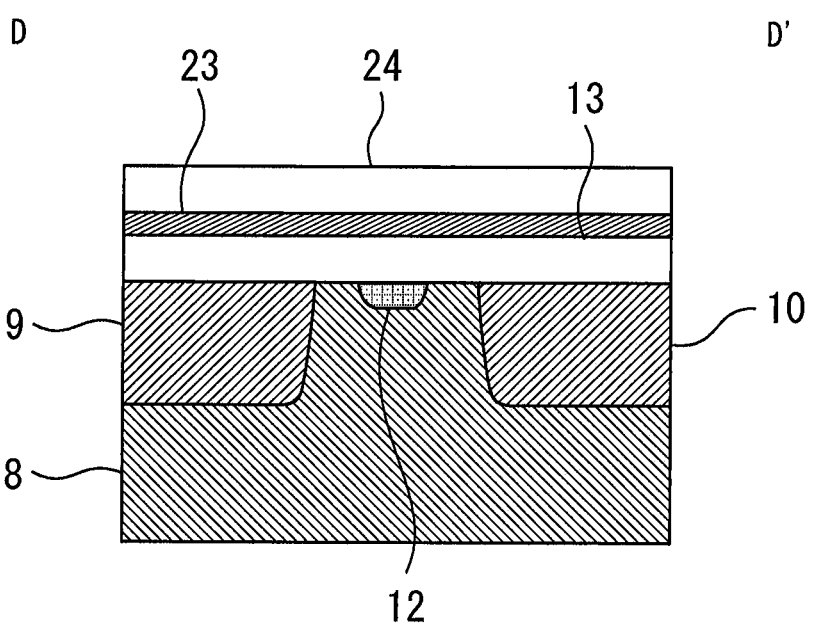
FIG. 7 is a sectional view along D-D' in FIG. 3.

FIG. 6 is a sectional view along C-C' in FIG. 3, and illustrates a sectional structure of an isolation part between the high withstand voltage MOS and the high withstand voltage isolation region at the side of the low side circuit region. FIG. 7 is a sectional view along D-D' in FIG. 3, and illustrates a sectional structure of an isolation part between the high withstand voltage MOS and the high withstand voltage isolation region at the side of the high side circuit region. Both are sectional views passing through the polysilicon 23.

The P type substrate 8 is exposed between the N type diffusion layer 9 and the N type diffusion layer 10, and this part configures the isolation part that isolates the N type diffusion layer 9 from the N type diffusion layer 10. At the side of the high side circuit region, the P type diffusion layer 12 having a higher impurity concentration than the P type substrate 8 is formed on the exposed principal surface of the P type substrate 8.

Figure 8:
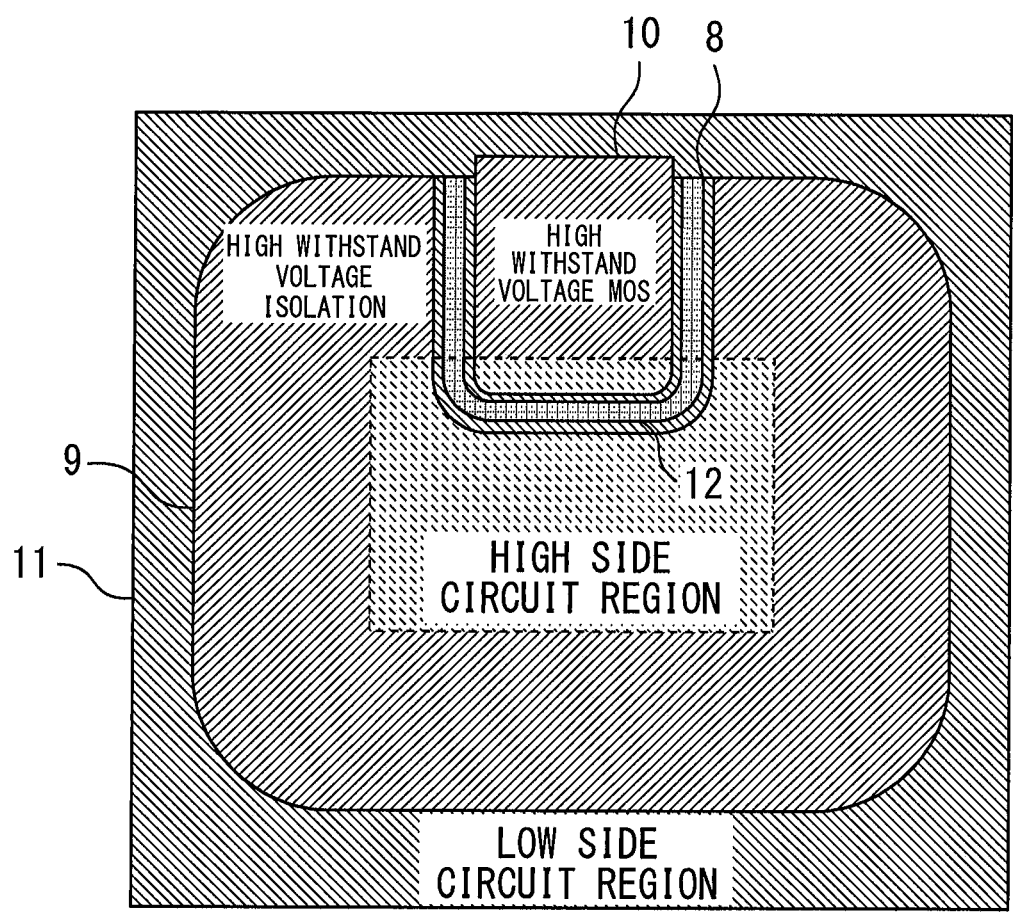
FIG. 8 is a plan view illustrating a semiconductor device according to the comparative example.

Subsequently, an effect of the present embodiment will be described by being compared with a comparative example. FIG. 8 is a plan view illustrating a semiconductor device according to the comparative example. In the comparative example, the P type diffusion layer 12 is in contact with the P type diffusion layer 11.

Figure 9:
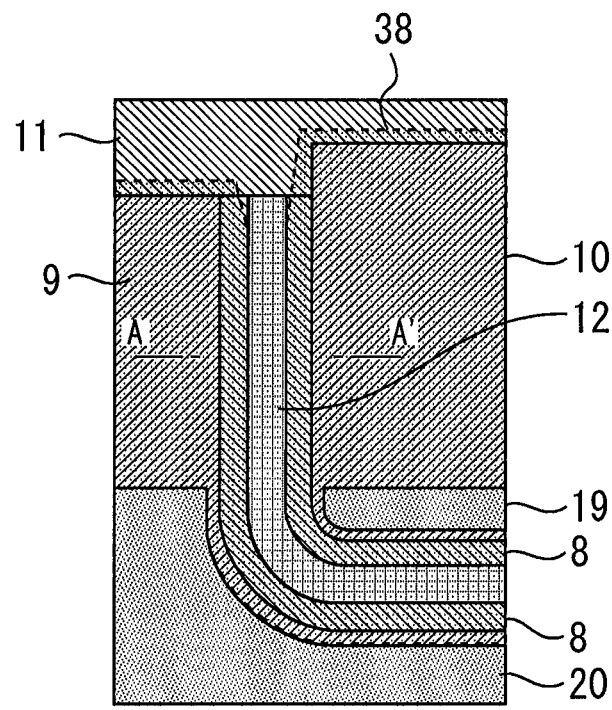
FIG. 9 is a plan view illustrating spread of a depletion layer of an isolation part between a high withstand voltage isolation region and a high withstand voltage MOS of a semiconductor device according to the comparative example.
Figure 10:
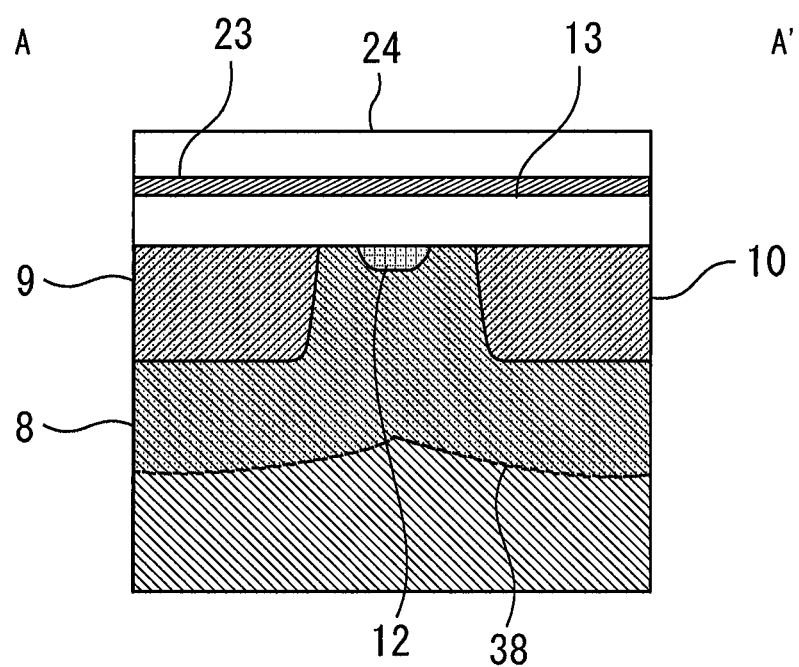
FIG. 10 is a sectional view along A-A' in FIG. 9.

FIG. 9 is a plan view illustrating spread of a depletion layer of an isolation part between a high withstand voltage isolation region and a high withstand voltage MOS of a semiconductor device according to the comparative example. FIG. 10 is a sectional view along A-A' in FIG. 9. N$^+$ type diffusion layers 19 and 20 are respectively N type diffusion layers for taking contact on high side parts of N type diffusion layers 10 and 9. A potential of the P type diffusion layer 11 of the low side circuit region is set at GND, and a high voltage is applied to the N$^+$ type diffusion layers 19 and 20 of the high side circuit region. In this case, the type diffusion layers 10 and 9 are completely depleted by the RESURF structure. A depletion layer 38 spreads from a PN junction interface of the N type diffusion layer 9 and the P type substrate 8, and a PN junction interface of the N type diffusion layer 10 and the P type substrate 8. Both pinch off, and the depletion layer 38 of the P type substrate 8 spreads toward a substrate lower surface.

On the other hand, a P type diffusion layer 12 is not completely depleted due to high concentration. In particular, at a side of the low side circuit region, a voltage that is applied across the P type substrate 8 and the N type diffusion layers 9 and 10 is low, and therefore, the P type diffusion layer 12 is in a state where the P type diffusion layer 12 is difficult to deplete more remarkably. In the comparative example, the P type diffusion layer 12 is electrically connected to the P type diffusion layer 11 having a potential of GND, and is not depleted. Accordingly, the potential is also fixed to GND at the side of the high side circuit region.

When the P type diffusion layer 12 is made to have a concentration such that a RESURF withstand voltage of the high withstand voltage isolation region and the high withstand voltage MOS does not decrease, suppression of formation of a parasitic channel becomes insufficient. Accordingly, in order to suppress formation of a parasitic channel, the thermal oxide film 13 which is formed on a top surface of the P type substrate 8 has to be made thick. Accordingly, heat treatment at a high temperature for a long time period becomes necessary, and a bird's beak formed on an edge of the thermal oxide film 13 becomes long, so that reduction in layout becomes difficult.

Since a high voltage is applied to the N type diffusion layers 9 and 10 at the side of the high side circuit region, a high potential difference occurs to between the P type diffusion layer 12 and the N type diffusion layers 9 and 10. Accordingly, an avalanche breakdown occurs in an interface of the P type diffusion layer 12 and the P type substrate 8, and a withstand voltage is reduced before the applied voltage reaches the RESURF withstand voltage.

Figure 11:
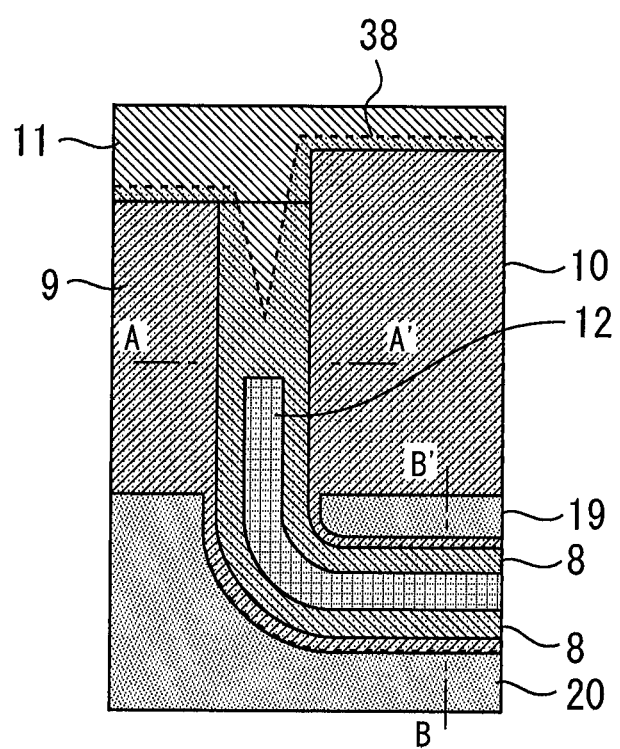
FIG. 11 is a plan view illustrating spread of the depletion layer of the isolation part between the high withstand voltage isolation region and the high withstand voltage MOS of the semiconductor device according to the first embodiment.
Figure 12:
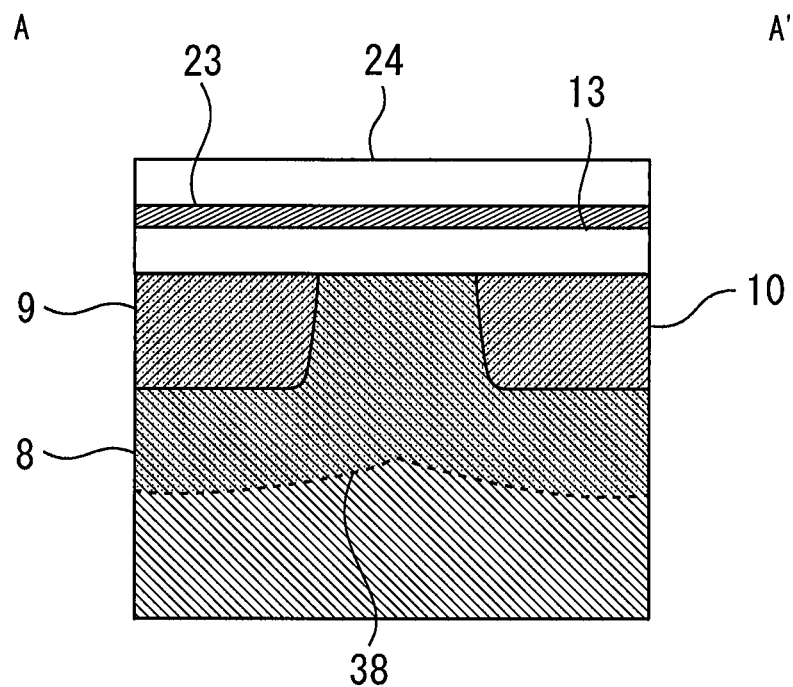
FIG. 12 is a sectional view along A-A' in FIG. 11.
Figure 13:
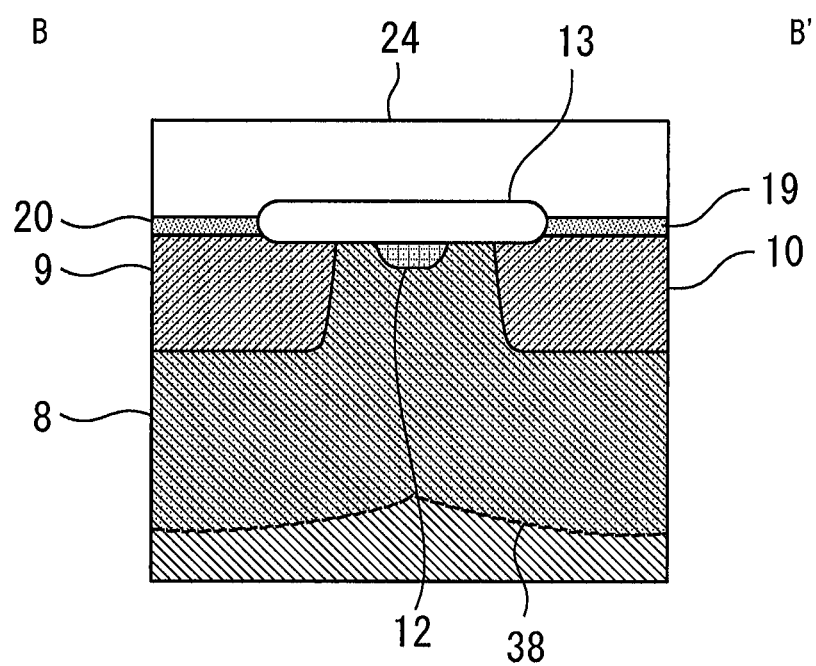
FIG. 13 is a sectional view along B-B' in FIG. 11.

FIG. 11 is a plan view illustrating spread of the depletion layer of the isolation part between the high withstand voltage isolation region and the high withstand voltage MOS of the semiconductor device according to the first embodiment. FIG. 12 is a sectional view along A-A' in FIG. 11. FIG. 13 is a sectional view along B-B' in FIG. 11.

The N type diffusion layers 9 and 10 are completely depleted by the RESURF structure. At the side of the low side circuit region, the surface of the P type substrate 8 sandwiched by the N type diffusion layer 9 and the N type diffusion layer 10 is completely depleted by the depletion layer 38 spreading from the PN junction interfaces with the N type diffusion layers on both sides pinching off.

At the side of the high side circuit region, the P type diffusion layer 12 having a high concentration is not completely depleted. The P type substrate 8 is completely depleted at the side of the low side circuit region, and therefore the potential of the P type diffusion layer 12 is isolated from the P type diffusion layer 11 of the GND potential and becomes floating. Accordingly, a voltage of the P type diffusion layer 12 rises to a high voltage in accordance with the N type diffusion layers 9 and 10. Thereby, a high potential difference does not occur between the P type diffusion layer 12 and the N type diffusion layers 9 and 10, so that an avalanche breakdown as in the comparative example does not occur, and a high withstand voltage can be obtained.

The high withstand voltage isolation region and the high withstand voltage MOS at the side of the low side circuit region are surrounded by the P type diffusion layer 11 at the GND potential, and a potential difference between the N type diffusion layer 9 and the N type diffusion layer 10 is small. Accordingly, even if the P type diffusion layer 12 does not exist on the principal surface of the P type substrate 8, a leak current between the N type diffusion layer 9 and the N type diffusion layer 10 due to a parasitic channel can be suppressed.

As described above, in the present embodiment, the P type diffusion layer 12 having a high concentration does not contact the P type diffusion layer 11 in the low side circuit region. Accordingly, the P type substrate 8 at the side of the low side circuit region is depleted, and the P type diffusion layer 12 at the side of the high side circuit region becomes electrically floating, so that reduction in RESURF withstand voltage can be suppressed. Further, by forming the P type diffusion layer 12 with a high concentration at the side of the high side circuit region where the potential difference occurs between the high withstand voltage MOS and the high withstand voltage isolation region, it is possible to suppress formation of a parasitic channel. Accordingly, it is possible to suppress a leak current between the high withstand voltage isolation region and the high withstand voltage MOS without reducing a RESURF withstand voltage of the high withstand voltage isolation region and the high withstand voltage MOS.

Note that a P type epitaxial layer may be formed on the P type substrate 8, and an N⁺ type embedded diffusion layer may be formed to contact an undersurface of the P type epitaxial layer. Further, instead of capacitive coupling by the polysilicon 23 and the metal wiring layer 30, polysilicon as a spiral resistor surrounding the outer periphery of the high side circuit region may be formed on the thermal oxide film 13.

Second Embodiment

Figure 14:
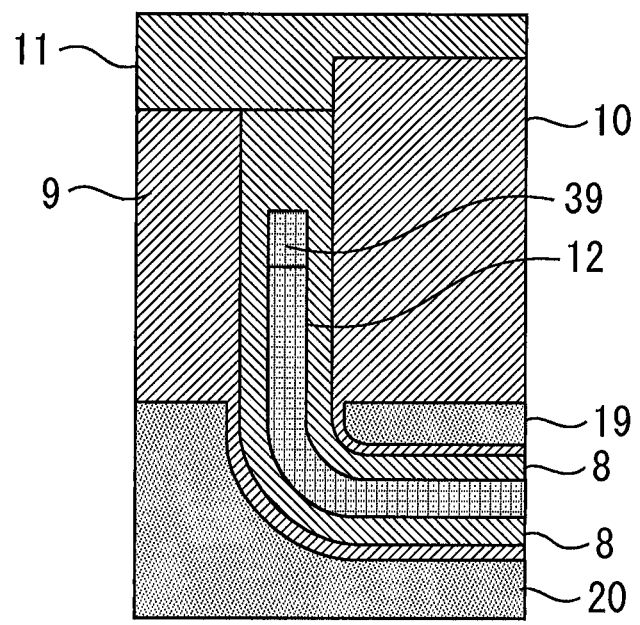
FIG. 14 is a plan view illustrating a semiconductor device according to a second embodiment.

FIG. 14 is a plan view illustrating a semiconductor device according to a second embodiment. A P type diffusion layer 39 is formed on a principal surface of a P type substrate 8 between the end portion of the P type diffusion layer 12 and a P type diffusion layer 11 and contacts an end portion of the P type diffusion layer 12. An impurity concentration of the P type diffusion layer 39 is lower than an impurity concentration of the P type diffusion layer 12 and higher than an impurity concentration of the P type substrate 8.

Figure 15:
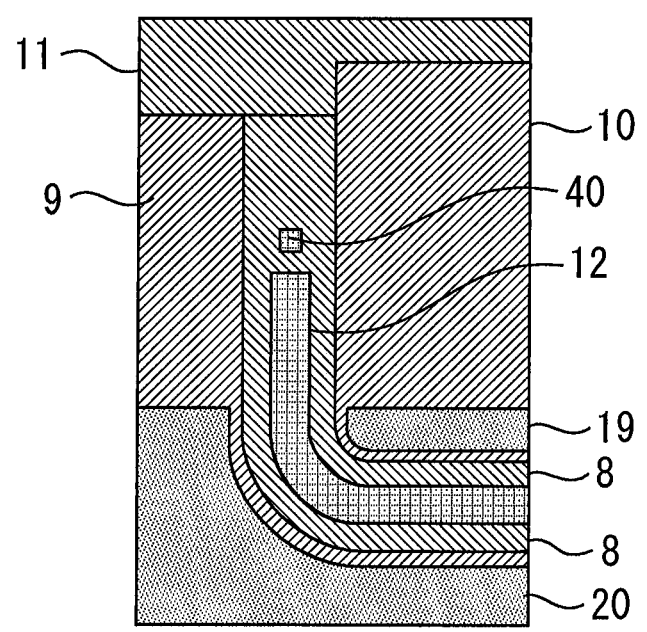
FIG. 15 is a plan view illustrating a production process of the semiconductor device according to the second embodiment.

FIG. 15 is a plan view illustrating a production process of the semiconductor device according to the second embodiment. In a same process as the process of impurity injection for forming the P type diffusion layer 12, a dot 40 is formed by injecting impurities into the P type substrate 8 from a dot-shaped injection window. By diffusing the impurities of the dot 40, the P type diffusion layer 39 is formed. The P type diffusion layer 39 has a low concentration due to diffusion of the impurities from the dot-shaped small injection window.

By forming the P type diffusion layer 39 having a lower concentration than the P type diffusion layer 12, electric field concentration in the end portion of the P type diffusion layer 12 is relaxed. Thereby, stability to suppression of withstand voltage reduction can be enhanced.

Third Embodiment

Figure 16:
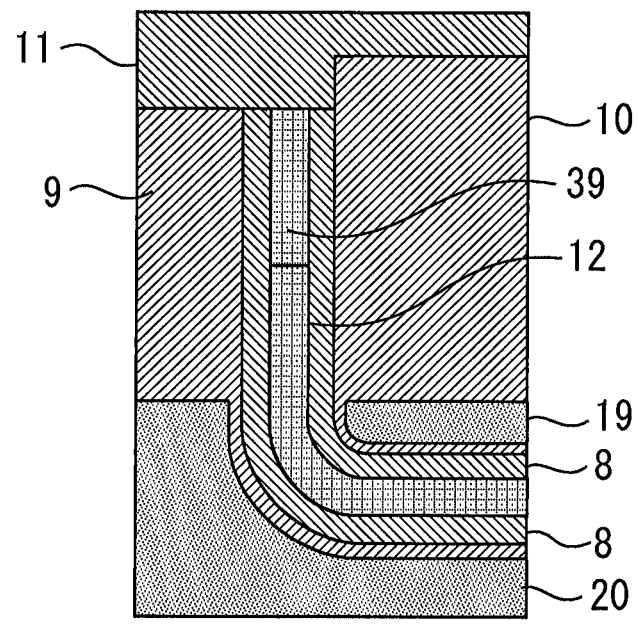
FIG. 16 is a plan view illustrating a semiconductor device according to a third embodiment.

FIG. 16 is a plan view illustrating a semiconductor device according to a third embodiment. In the second embodiment, the P type diffusion layer 39 is isolated from the P type diffusion layer 11 in the low side circuit region, whereas in the present embodiment, the P type diffusion layer 39 contacts the P type diffusion layer 11 in the low side circuit region.

Figure 17:
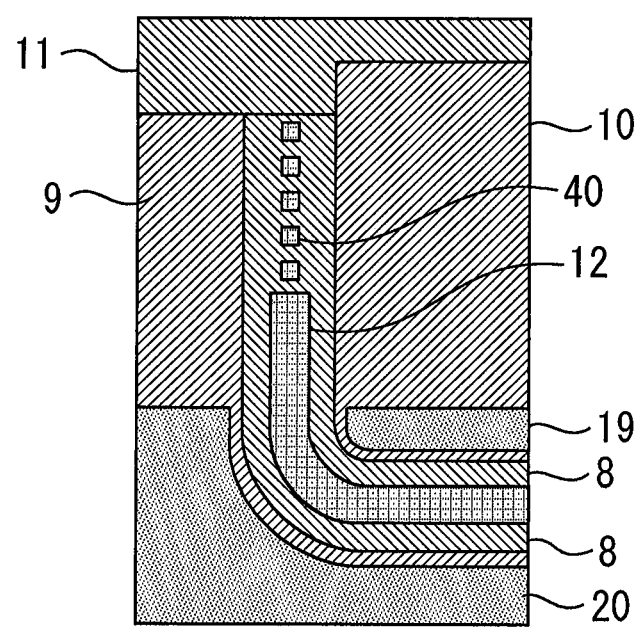
FIG. 17 is a plan view illustrating a production process of the semiconductor device according to the third embodiment.

FIG. 17 is a plan view illustrating a production process of the semiconductor device according to the third embodiment. In a same process as impurity injection for forming the P type diffusion layer 12, a plurality of dots 40 are formed by injecting impurities into the P type substrate 8 from dot-shaped injection windows positioned in a row. By diffusing the impurities of the dots 40, the P type diffusion layer 39 is formed. The P type diffusion layer 39 has a low concentration due to diffusion of the impurities from the dot-shaped small injection windows.

The P type diffusion layer 39 having a low concentration is depleted when the potential of the P type diffusion layer 11 in the low side circuit region is set at GNU, and a high voltage is applied to the N⁺ type diffusion layers 19 and 20 in the high side circuit region, and therefore withstand voltage reduction is suppressed. Further, the P type diffusion layer 39 having a higher concentration than the P type substrate 8 contacts the P type diffusion layer 11, so that a leak current between the N type diffusion layer 9 and the N type diffusion layer 10 can be further suppressed.

Fourth Embodiment

Figure 18:
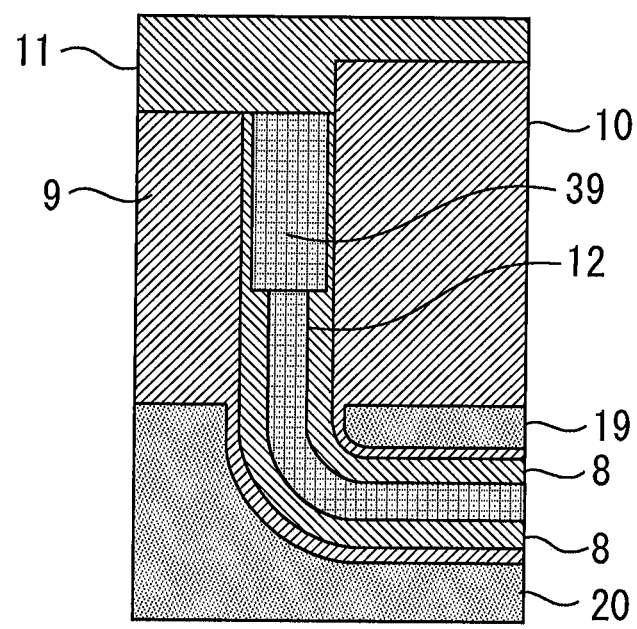
FIG. 18 is a plan view illustrating a semiconductor device according to a fourth embodiment.

FIG. 18 is a plan view illustrating a semiconductor device according to a fourth embodiment. In the first embodiment, a width of the P type diffusion layer 39 is the same as a width of the P type diffusion layer 12, whereas in the present embodiment, a width of a P type diffusion layer 39 is larger than a width of a P type diffusion layer 12.

Figure 19:
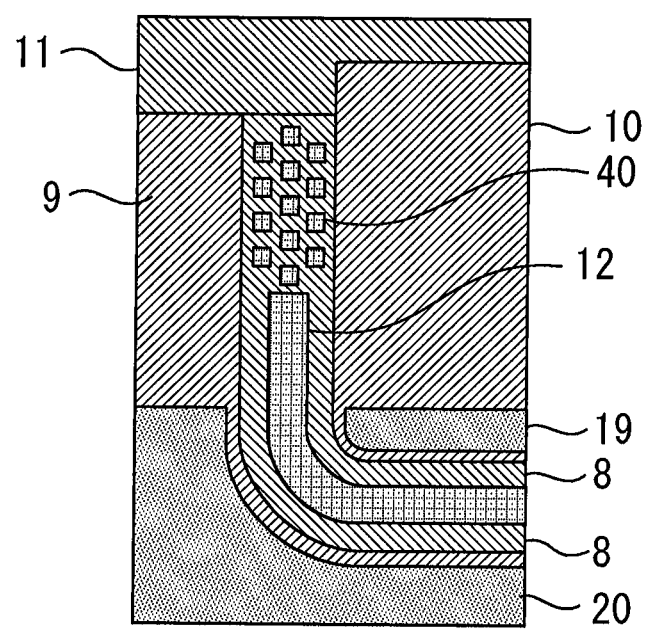
FIG. 19 is a plan view illustrating a production process of the semiconductor device according to the fourth embodiment.

FIG. 19 is a plan view illustrating a production process of the semiconductor device according to the fourth embodiment. In the same process as impurity injection for forming the P type diffusion layer 12, a plurality of dots 40 are formed by injecting impurities into a P type substrate 8 from dot-shaped injection windows positioned in a plurality of rows. By diffusing the impurities of the dots 40, the P type diffusion layer 39 is formed. The P type diffusion layer 39 has a low concentration due to diffusion of the impurities from the dot-shaped small injection windows.

The P type diffusion layer 39 having a low concentration is depleted when the potential the P type diffusion layer 11 in the low side circuit region is set at GND, and a high voltage is applied to the N$^+$ type diffusion layers 19 and 20 in the high side circuit region, and therefore withstand voltage reduction is suppressed. Further, the P type diffusion layer 39 having a higher concentration than the P type substrate 8 is formed to be wide, so that a leak current between the N type diffusion layer 9 and the N type diffusion layer 10 can be further suppressed.

Fifth Embodiment

Figure 20:
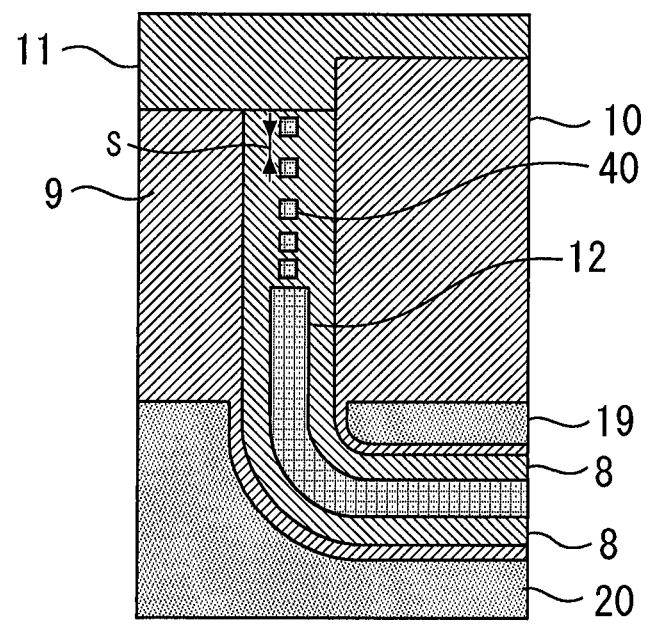
FIG. 20 is a plan view illustrating a production process of a semiconductor device according to a fifth embodiment.

FIG. 20 is a plan view illustrating a production process of a semiconductor device according to a fifth embodiment. A plurality of dots 40 are formed by injecting impurities into a P type substrate 8 from a plurality of dot-shaped injection windows. By diffusing the impurities of the dots 40, a P type diffusion layer 39 is formed.

Spaces S among the dots 40 are gradually increased from a high side circuit region to a low side circuit region. As the space S between adjacent dots 40 is wider, overlap of impurities diffused from the adjacent dots 40 decreases. Accordingly, an impurity concentration of the P type diffusion layer 39 gradually becomes lower from the high side circuit region to the low side circuit region.

When a potential of a P type diffusion layer 11 in the low side circuit region is set at GND, and a high voltage is applied to N$^+$ type diffusion layers 19 and 20 in the high side circuit region, a potential difference applied between the P type substrate 8 and N type diffusion layers 9 and 10 gradually increases from the side of the low side circuit region to the side of the high side circuit region. Consequently, the P type substrate 8 is easily depleted gradually from the side of the low side circuit region to the side of the high side circuit region. When a potential difference corresponding to a control circuit power supply voltage is applied between the N$^+$ type diffusion layer 19 and the N$^+$ type diffusion layer 20, a potential difference between the N type diffusion layer 9 and the N type diffusion layer 10 gradually decreases from the side of the high side circuit region to the side of the low side circuit region. Consequently, a leak current due to a parasitic channel gradually decreases from the side of the high side circuit region to the side of the low side circuit region.

In contrast with this, in the present embodiment, the impurity concentration of the P type diffusion layer 39 is gradually decreased from the side of the high side circuit region to the side of the low side circuit region. Thereby, the concentration of the P type diffusion layer 39 can be made an optimal value to both suppression of withstand voltage reduction and suppression of the leak current due to the parasitic channel, in each of positions between the high side circuit region and the low side circuit region.

Sizes of the injection windows may be gradually decreased from the high side circuit region to the low side circuit region. By making the injection windows small, the concentration of the diffusion layer to be formed is reduced. In this case, the impurity concentration of the P type diffusion layer 39 becomes gradually lower from the high side circuit region to the low side circuit region, and therefore, the above described effect can be obtained.

Sixth Embodiment

Figure 21:
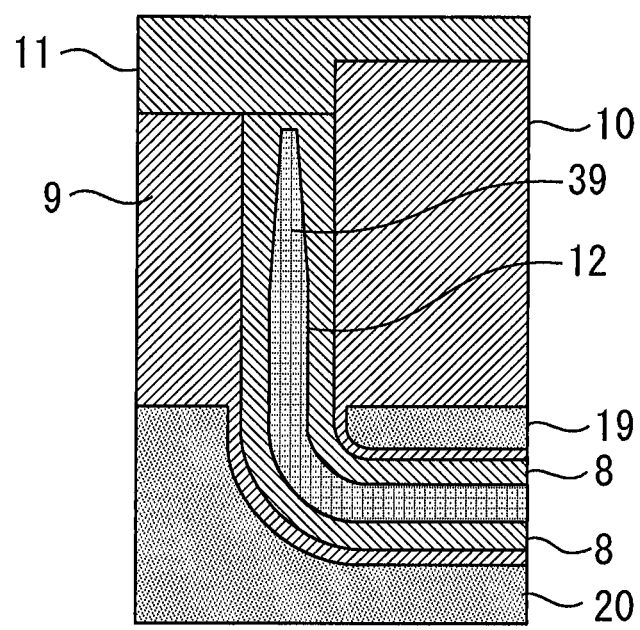
FIG. 21 is a plan view illustrating a semiconductor device according to a sixth embodiment.

FIG. 21 is a plan view illustrating a semiconductor device according to a sixth embodiment. A width of a P type diffusion layer 39 gradually becomes smaller from a high side circuit region to a low side circuit region. Thereby, a same effect as in the fifth embodiment can be obtained. Further, the effect can be realized with a simpler layout design as compared with the ease of using the dot-shaped injection windows. Note that a low side end portion of the P type diffusion layer 39 has such a width that it is depleted when a potential of a P type diffusion layer 11 in the low side circuit region is set at GND, and a high voltage is applied to the N$^+$ type diffusion layers 19 and 20 in the high side circuit region, and the end portion may be in contact with the P type diffusion layer 11.

Seventh Embodiment

Figure 22:
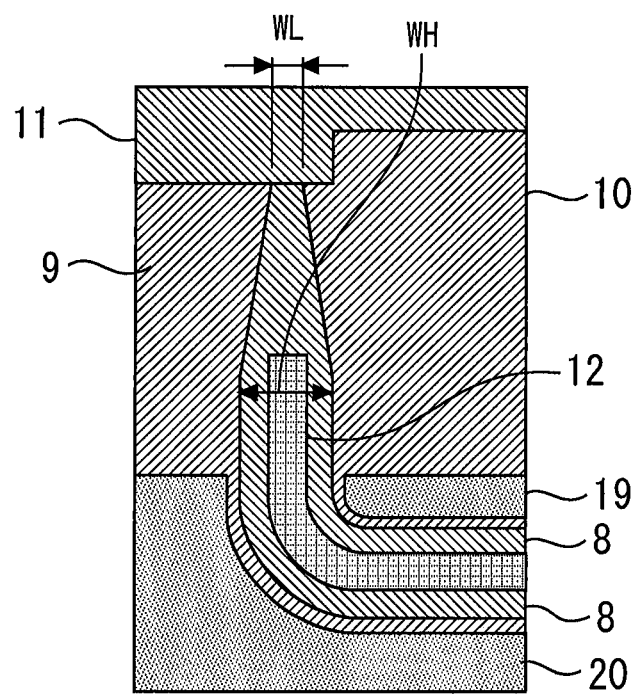
FIG. 22 is a plan view illustrating a semiconductor device according to a seventh embodiment.

FIG. 22 is a plan view illustrating a semiconductor device according to a seventh embodiment, in the first embodiment, the width of the P type substrate 8 exposed between the N type diffusion layer 9 and the N type diffusion layer 10 is constant. In contrast with this, in the present embodiment, the width gradually becomes smaller from a high side circuit region to a low side circuit region. When a width at a side of the low side circuit region is set as WL, and a width at a side of the high side circuit region is set as WH, WL<WH is established. A width of the P type substrate 8 which needs to be depleted is made smaller toward the low side circuit region. Thereby, when a potential of a P type diffusion layer 11 in the low side circuit region is set at GNU, and a high voltage is applied to the N$^+$ type diffusion layers 19 and 20 in the high side circuit region, a depletion layer that spreads from a PN junction interface between the P type substrate 8 and the N type diffusion layers 9 and 10 to a P type substrate 8 side easily pinches off. Accordingly, withstand voltage reduction can be further suppressed.

The P type substrate 8 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-006048, filed on Jan. 17, 2020 including specification, claims, drawings and summary, on which the convention priority of the present application is based, is incorporated herein by reference in its entirety,

The invention claimed is:

1. A semiconductor device comprising:
a high side circuit region;
a low side circuit region; and
a RESURF isolation structure surrounding an outer periphery of the high side circuit region and isolating the high side circuit region from the low side circuit region,
wherein the high side circuit region, the low side circuit region and the RESURF isolation structure are formed on a single semiconductor substrate of a first conductivity type,
the RESURF isolation structure has a high withstand voltage isolation region and a high withstand voltage MOS,
the high withstand voltage isolation region has a first diffusion layer of a second conductivity type formed on a principal surface of the semiconductor substrate,
the high withstand voltage MOS has a second diffusion layer of the second conductivity type formed on the principal surface of the semiconductor substrate,
the low side circuit region has a third diffusion layer of the first conductivity type formed on the principal surface of the semiconductor substrate,
a fourth diffusion layer of the first conductivity type having a higher impurity concentration than the semiconductor substrate is formed on the principal surface of the semiconductor substrate exposed between the first diffusion layer and the second diffusion layer, and
the fourth diffusion layer extends from the high side circuit region to the low side circuit region and does not contact the third diffusion layer.

2. The semiconductor device according to claim 1, wherein a fifth diffusion layer of the first conductivity type is formed on the principal surface of the semiconductor substrate between an end portion of the fourth diffusion layer and the third diffusion layer and contacts an end portion of the fourth diffusion layer, and
an impurity concentration of the fifth diffusion layer is lower than an impurity concentration of the fourth diffusion layer and is higher than an impurity concentration of the semiconductor substrate.

3. The semiconductor device according to claim 2, wherein the fifth diffusion layer contacts the third diffusion layer.

4. The semiconductor device according to claim 2, wherein a width of the fifth diffusion layer is larger than a width of the fourth diffusion layer.

5. The semiconductor device according to claim 3, wherein a width of the fifth diffusion layer is larger than a width of the fourth diffusion layer.

6. The semiconductor device according to claim 2, wherein an impurity concentration of the fifth diffusion layer gradually becomes lower from the high side circuit region to the low side circuit region.

7. The semiconductor device according to claim 3, wherein an impurity concentration of the fifth diffusion layer gradually becomes lower from the high side circuit region to the low side circuit region.

8. The semiconductor device according to claim 4, wherein an impurity concentration of the fifth diffusion layer gradually becomes lower from the high side circuit region to the low side circuit region.

9. The semiconductor device according to claim 5, wherein an impurity concentration of the fifth diffusion layer gradually becomes lower from the high side circuit region to the low side circuit region.

10. The semiconductor device according to claim 1, wherein a fifth diffusion layer of the first conductivity type is formed on the principal surface of the semiconductor substrate between an end portion of the fourth diffusion layer and the third diffusion layer, and
a width of a fifth diffusion layer gradually becomes smaller from the high side circuit region to the low side circuit region.

11. The semiconductor device according to claim 1, wherein a width of the semiconductor substrate exposed between the first diffusion layer and the second diffusion layer becomes smaller from the high side circuit region to the low side circuit region.

12. The semiconductor device according to claim 2, wherein a width of the semiconductor substrate exposed between the first diffusion layer and the second diffusion layer becomes smaller from the high side circuit region to the low side circuit region.

13. The semiconductor device according to claim 3, wherein a width of the semiconductor substrate exposed between the first diffusion layer and the second diffusion layer becomes smaller from the high side circuit region to the low side circuit region.

14. The semiconductor device according to claim 4, wherein a width of the semiconductor substrate exposed between the first diffusion layer and the second diffusion layer becomes smaller from the high side circuit region to the low side circuit region.

15. The semiconductor device according to claim 5, wherein a width of the semiconductor substrate exposed between the first diffusion layer and the second diffusion layer becomes smaller from the high side circuit region to the low side circuit region.

16. The semiconductor device according to claim 1, wherein the semiconductor substrate is formed of a wide-band-gap semiconductor.

17. The semiconductor device according to claim 2, wherein the semiconductor substrate is formed of a wide-band-gap semiconductor.

18. The semiconductor device according to claim 3, wherein the semiconductor substrate is formed of a wide-band-gap semiconductor.

19. The semiconductor device according to claim 4, wherein the semiconductor substrate is formed of a wide-band-gap semiconductor.

20. The semiconductor device according to claim 5, wherein the semiconductor substrate is formed of a wide-band-gap semiconductor.

21. The semiconductor device according to claim 1, wherein the fourth diffusion layer extends from the high side circuit region to the low side circuit region to separate the first diffusion layer from the second diffusion layer.

22. The semiconductor device according to claim 1, wherein the fourth diffusion layer is formed on an exposed portion of the principal surface of the semiconductor substrate of the first conductivity type that extends between the first diffusion layer and the second diffusion layer such that the exposed portion is between the first diffusion layer and the second diffusion layer.

* * * * *